(12) United States Patent
Chen et al.

(10) Patent No.: US 7,443,194 B1
(45) Date of Patent: Oct. 28, 2008

(54) I/O DRIVER FOR INTEGRATED CIRCUIT WITH OUTPUT IMPEDANCE CONTROL

(75) Inventors: David Jia Chen, Endwell, NY (US); William Frederick Lawson, Vestal, NY (US); David William Mann, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/109,285

(22) Filed: Apr. 24, 2008

(51) Int. Cl.
*H03K 19/003* (2006.01)

(52) U.S. Cl. .......................................... 326/30; 326/82

(58) Field of Classification Search .................. 326/30, 326/62, 82
See application file for complete search history.

(56) References Cited

U.S. PATENT DOCUMENTS

| | | | |
|---|---|---|---|
| 5,097,148 A | 3/1992 | Gabara | |
| 5,134,311 A | 7/1992 | Biber et al. | |
| 5,546,033 A | 8/1996 | Campbell et al. | |
| 5,581,197 A | 12/1996 | Motley et al. | |
| 5,594,373 A | 1/1997 | McClure | |
| 5,811,997 A | 9/1998 | Chengsson et al. | |
| 6,087,853 A | 7/2000 | Huber et al. | |
| 6,118,310 A | 9/2000 | Esch, Jr. | |
| 6,177,817 B1 | 1/2001 | Fifield et al. | |
| 6,184,730 B1 | 2/2001 | Kwong et al. | |
| 6,268,750 B1 | 7/2001 | Esch, Jr. | |
| 6,437,611 B1 | 8/2002 | Hsiao et al. | |
| 6,624,671 B2 | 9/2003 | Fotouhi | |
| 6,759,868 B2 | 7/2004 | Helt et al. | |
| 6,812,734 B1 * | 11/2004 | Shumarayev et al. | ......... 326/30 |
| 6,847,235 B2 | 1/2005 | Graves | |
| 6,943,588 B1 | 9/2005 | Luo et al. | |
| 6,949,949 B2 | 9/2005 | Lundberg | |
| 7,088,127 B2 | 8/2006 | Ngyuen et al. | |
| 7,095,246 B2 | 8/2006 | Kiyoshi et al. | |
| 7,123,055 B1 * | 10/2006 | Chong et al. | ................... 326/87 |
| 7,176,729 B2 * | 2/2007 | Hayashi et al. | ............. 327/108 |
| 2003/0025535 A1 | 2/2003 | Raychaudhri | |

FOREIGN PATENT DOCUMENTS

EP   0 735 687 A2   10/1996

OTHER PUBLICATIONS

Esch, G., Jr. "Design of CMOS I/O Drivers with Less Sensitivity to Process, . . . " Electronic Design, Test and Application, 2004; Delta 2004; Second IEEE Int. Workshop, pp. 28-30.

(Continued)

*Primary Examiner*—James H Cho
(74) *Attorney, Agent, or Firm*—Thorne & Halajian, LLP

(57) ABSTRACT

An I/O driver has v/i characteristic control for maintaining a substantially flat output impedance response using a transmission gate configuration at an I/O output pad. The configuration includes a linear resistive element electrically connected at an I/O pad for limiting a processed data I/O signal, an active impedance element for receiving and processing the data signal, which comprises data represented by a series of voltage state transitions, and pull-up and pull-down array calibration words, for generating and outputting a processed I/O output signal to the resistive element to output a substantially flat v/i response at switching of the data signal.

3 Claims, 2 Drawing Sheets

OTHER PUBLICATIONS

Figure 1:
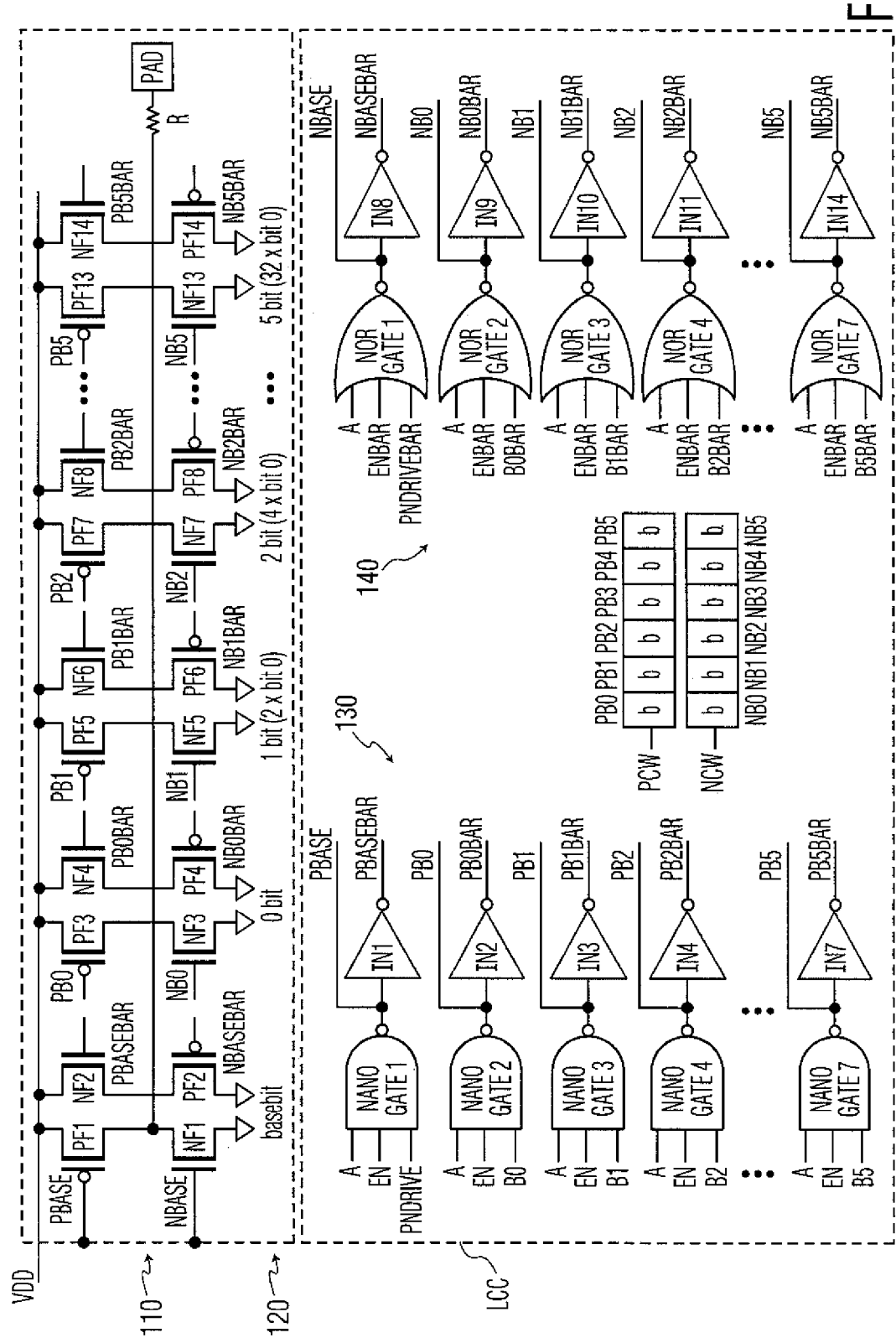

Choy, C.S. et al., "A Feedback Control Circuit Design Technique to . . . " Circuits & Systems, 1995. ISCAS '95., 1995 IEEE Int. Symp. 1995 Seattle, WA, USA; vol. 1, pp. 307-310.

Esch, G., Jr. et al. "Near-Linear CMOS I/O Driver with Less Sensitivity . . . " Very Large Scale Integration Systems, IEEE Transactions Nov. 2004, vol. 12, Issue 11, pp. 1253-1257.

* cited by examiner

I/O DRIVER FOR INTEGRATED CIRCUIT WITH OUTPUT IMPEDANCE CONTROL

The present invention relates broadly to I/O drivers for integrated circuits (ICs), and more directly to I/O drivers for improving output impedance response during switching.

BACKGROUND OF THE INVENTION

Integrated circuits (ICs) send signals outside of the IC circuitry using output driver circuits or drivers. Input/output (I/O) drivers present signals to output signal pads, which connect to a pin, the set of pins referred to as the packaging. The pin or packaging connects to a trace or bus. The signal pad displays inherent parasitic resistance, inductance, and capacitance (sometimes referred to as the characteristic package impedance). The characteristic package impedance affects transmission of the output signal from the signal pad (i.e., the IC). The trace in receipt of the output signal displays transmission line characteristics: resistance, capacitance and inductance (sometimes referred to as the characteristic impedance). The characteristic impedance also affects transmission of the output signal from the signal pad.

Maintaining the output impedance of I/Os is extremely important for maintaining signal integrity of the data being transmitted. Various conditions affect signal quality. For example, where the characteristic package impedance at the I/O pad or pin, and the characteristic impedance of the transmission line (i.e., a trace to which the package is connected) are mismatched, signal reflections occur during voltage level switching of (data) signals. The signal reflections result in undesirable signal degradation. Mismatched impedance can occur for any number of reasons. For example, as the manufacturing process, operating temperature, and voltage supply rails vary, the output impedance of the I/O also tends to vary. The problem is acute at switching, where the output impedance response can vary significantly as the output signal (at the pad) transitions between voltage levels.

Calibrated I/O drivers have been developed to overcome fluctuating I/O output impedance at switching. Calibrated I/Os continually adjust the strength of the output driver stage in an attempt to maintain a constant output impedance at switching. Unfortunately, the output impedance is often linear only over a small range of the output voltage, so a calibrated output does not overcome the problem of fluctuating output impedance for the entire voltage switching range. Switching between logical voltage levels, for example, from a low voltage level to a high voltage level, takes a fixed time period. The initial portion of such a fixed time requires a much larger amount of current than the latter portions of this switching period. U.S. Pat. No. 6,268,750 ("the '750 patent"), incorporated by reference, discloses a circuit for flattening the I/O output impedance response at switching, which improved the then-known calibrated I/Os.

The flattening circuit of the '750 patent includes a combination of pull-up PFETs arranged in a pull-up PFET array. The pull-up PFETs are programmatically enabled by a pull-up calibration word pu_n [5:0], and a pull_up signal to drive an I/O output pad high. The flattening circuit also includes a combination of pull-down NFETs arranged in a pull-down NFET array. The pull-down NFETs are programmatically enabled by a pull-down calibration word pd [5:0], and a pull_down signal to drive the I/O output pad low. The FET arrays are sized such that they exhibit conductance values corresponding to their binary weighted bit position in their respective calibration word pu_n[n:0] or pd[n:0]. Each FET has a conductance value about equal to $2^{bit\ position}G$. Thus, if bit 0 of the calibration word controls a FET with conductance G, bit 1 of the calibration word controls a FET with a conductance 2G, bit 2 of the calibration word controls a FET with a conductance 4G, and so on.

In effect, as the calibration word binary count increments, more resistors are added in parallel in the driver FET array, and reflected in the output impedance response. The construction of the '750 patent flattening circuit requires separate and independent calibration words for each of the pull-up PFET and pull-down NFET arrays. For that matter, due to the non-linear nature of the FET array operation at the time of switching, the output impedance over the different stages of the switching period can still vary undesirably.

Included in the pull-up PFET array is an NFET, and included in the pull-down NFET array is a PFET. Including the complementary NFET with the pull-up PFETs, and the complementary PFET with the pull-down NFETs enables the output driver to supply more current in the initial stages of voltage transitions in attempt to better control the voltage to current ratio and therefore the output signal integrity at switching. Supplying more current through the complementary NFET results in a flatter overall output resistance response during the voltage transition. For example, during a low-to-high transition, the pull-up NFET is conducting. As the output voltage $V_o$ approaches $V_{DD}-V_t$ from 0V, the pull-up NFET enters the cut-off region. The pull-up NFET is cutoff where $(V_{DD}-V_t) \leq V_o \leq V_{DD}$, and the pull-up PFET array then determines the driver output impedance. The pull-down PFET behaves in a similar fashion during a high-to-low transition.

SUMMARY OF THE INVENTION

The present invention provides an I/O driver circuit that overcomes the shortcomings of conventional I/O drivers.

The I/O driver circuit of the invention controls I/O output impedances using a combination of FET pull-up and pull-down stages in series with a linear resistive element. The pull-up and pull-down stages include respective PFET and NFET arrays, which are controlled to exhibit predefined conductances by a logical circuit and respective pull-up and pull-down calibration words. The combined programmed conductance values in the active PFET and NFET devices operate to better maintain output impedance or voltage/current (v/i) output characteristic linearity for the entire switching period, whether transitioning from a first to a second voltage level, or transitioning from the second to the first voltage level. For that matters the NFETS are arranged in a stack of at least two NFETs in order to provide enhanced ESD protection.

The I/O driver circuit of the invention may be described as a configuration formed with the active FET-based pull-up and pull-down stages in series with a resistive element that exhibits a large linear resistance. The resistive element is included so that its linear resistance value is always a significant portion of the magnitude of the v/i output characteristic at the pad, to better stabilize the output v/i characteristic than known I/O drivers controlled with active FET devices that produce a v/i output characteristic that is not balanced with a substantial conventional resistive element. As such the resistive element should have a magnitude at least as large, and preferably 4 times as large as the active matching element comprising the pull-up and pull-down FET arrays. As preferred, the total series impedance at each pad output includes an eighty-percent contribution from the linear resistive element.

BRIEF DESCRIPTION OF THE DRAWING FIGURES

Figure 2:
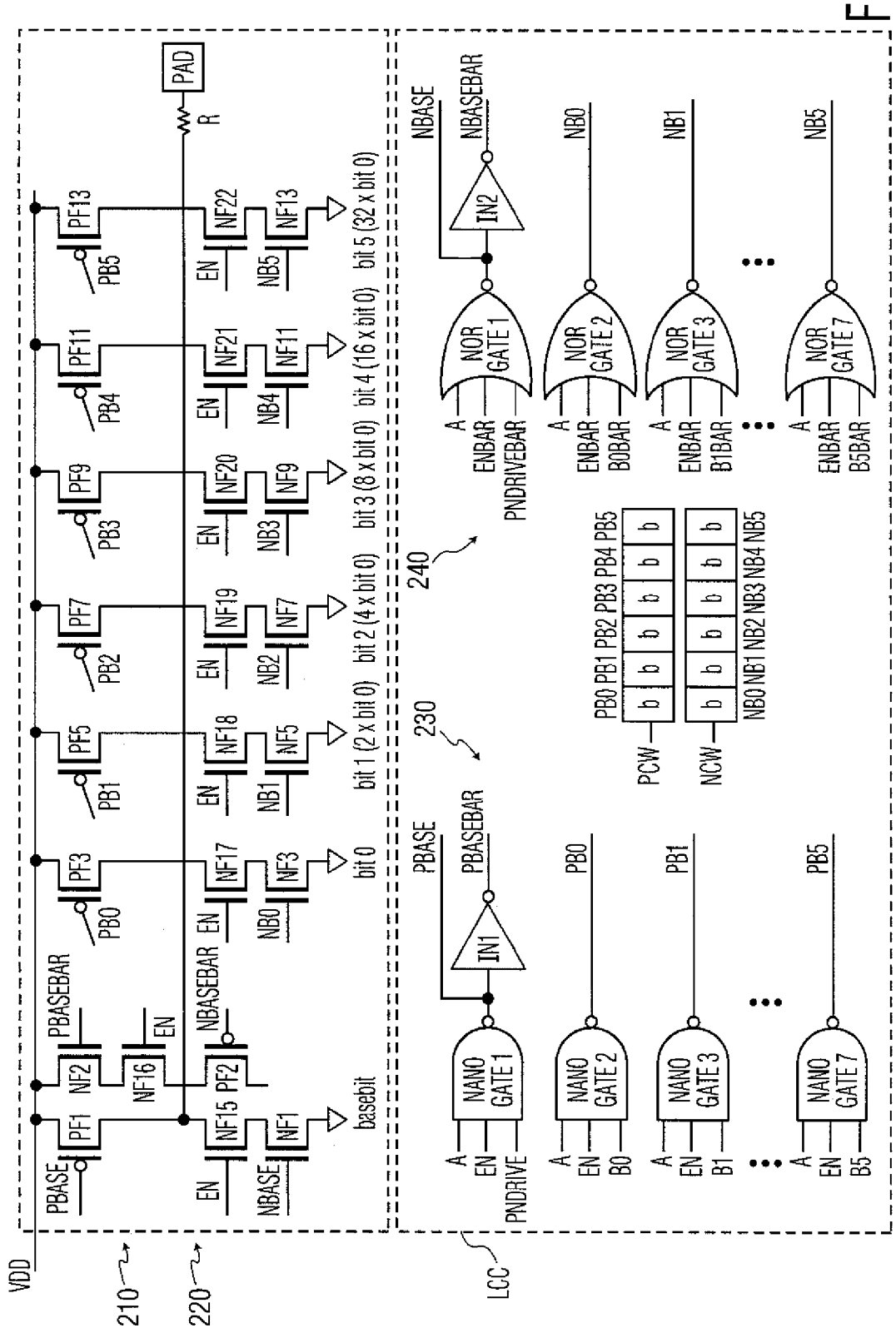

In order that the manner in which the above recited and other advantages of the invention may be obtained, a more particular description of the invention briefly described above is rendered by reference to specific embodiments thereof that are illustrated in the appended drawings. Understanding that these drawings depict typical embodiments of the invention and are not therefore to be considered to be limiting of its scope, the invention is described and explained with additional specificity and detail through use of the accompanying drawings in which:

FIG. 1 is a schematic circuit diagram depicting one embodiment of an I/O driver with v/i output characteristic control of the invention; and FIG. 2 is a second embodiment of the I/O driver with v/i output characteristic control of the invention.

DETAILED DESCRIPTION OF THE INVENTION

Reference will now be made in detail to the present invention, examples of which are illustrated in the accompanying drawings, wherein like reference numerals refer to like elements throughout.

FIG. 1 shows one embodiment of an I/O driver with output impedance control for maintaining a substantially flat output impedance response. The I/O driver may be described as a transmission gate configuration. The configuration comprises a resistive element (R), connected between an active impedance matching element and an I/O output pad (PAD). The active impedance matching element is controlled by a logical control circuit (LCC). The logical control circuit (LCC) receives a data signal A comprising a time series of voltage state transitions, e.g., between logic one and logic zero, representative of digital I/O data, enable signals EN and PNDRIVE and calibration control words PCW and NCW. Calibration control words PCW and NCW control respective PFET pull-up (e.g., to VDD) and NFET pull-down arrays (e.g., to ground) as explained below.

The logical control circuit (LCC) utilizes these signals to generate logical control signals to control operation of the individual FET devices comprising pull-up and pull-down stages in the active impedance matching element. The active impedance matching element output impedance is therefore controlled by controlling the pull-up and pull-down stages. It is this controlled active output impedance in series combination with the fixed linear resistive element or resistor that defines the pad output response at switching.

The linear resistive element R may be configured to provide a major portion of the pad output impedance such as 50% to 80%, where the remaining output impedance is provided by the active impedance matching element. The combination provides for improved control and linearity in the pad output impedance. For example, when the desired output impedance is fifty (50) ohms, the linear resistive element R may contribute at least twenty-five (25) ohms of the controlled output impedance response, and preferably about forty (40) ohms. As such, the overall linearity of the output driver would likely benefit from improving the linearity of the active impedance matching element. Such a calibration analysis may be done on a case by case basis. The designer should determine the bits and corresponding binary weighted v/i response contribution that should be augmented for the extra current at switching.

The active impedance matching element comprises a PFET pull-up stage (110) and an NFET pull down stage (120). The PFET pull-up stage comprises an array of pull-up PFETs: PF3, PF5, PF7, PF9, PF11 and PF13. The six PFETs exhibit conductance values when activated by the pull-up calibration word (PCW) that corresponds to multiples of their bit weighted positions in the array, as is known. The bits comprising the pull-up calibration word are shown individually as signals PB0, PB1, PB2, PB3, PB4 and PB5. The PFET pull-up stage (110) also comprises a base PFET device PF1 that is activated by signal PBASE as shown. Complementary NFET devices NF2 (base), NF4, NF6, NF8, NF10, NF12 and NF14 are connected in parallel with the base PFET (the base bit), and with each PFET device PF3, PF5, PF7, PF9, PF11, PF13 in the PFET array (the pull-up stage; 110), respectively. The complementary base NFET device is activated by a signal PBASEBAR. Complementary NFETs: NF4, NF6, NF8, NF10, NF12 and NF14 are activated by respective signals PB0BAR, PB1BAR, PB2BAR, PB3BAR, PB4BAR and PB5BAR.

The NFET pull-down stage (120) comprises an array of pull-down NFETs: NF3, NF5, NF7, NF9, NF11 and NF13. The six NFETs exhibit conductance values when activated by the pull-down calibration word (NCW) that corresponds to multiples of their bit weighted positions in the array, as is known. The bits comprising the pull-down calibration word NCW are shown individually as signals NB0, NB1, NB2, NB3, NB4 and NB5. The pull-down stage also comprises a base NFET device NF1 that is activated by signal NBASE as shown. Complementary PFET devices PF2 (base), PF4, PF6, PF8, PF10, PF12 and PF14 are connected in parallel with the base NFET (NF1), and with each NFET device in the NFET array (the pull-down stage). The complementary base PFET device is activated by a signal NBASEBAR. Complementary PFETs: PF4, PF6, PF8, PF10, PF12 and PF14 are activated by respective signals NB0BAR, NB1BAR, NB2BAR, NB3BAR, NB4BAR and NB5BAR.

The logical control section LCC includes NAND-based control logic (130) for generating the signals to control the pull-up stage, and NOR-based control logic (140) for generating the signals to control the pull-down stage.

In the NAND-based control logic (130) for controlling the pull-up stage, a first NAND GATE 1 generates control signal PBASE by NAND-ing data input signal (A), enable signal EN (for enabling output I/O driver operation) and a base device activate signal PNDRIVE. An inverter element IN1 connected to the first NAND GATE 1 output inverts signal PBASE to generate signal PBASEBAR. PBASEBAR controls the complementary NFET (NF2) connected in parallel with the PFET base device (PF1), as mentioned. The NAND-based control logic includes six other NAND gates: NAND GATE 2, NAND GATE 3, NAND GATE 4, NAND GATE 5, NAND GATE 6 and NAND GATE 7. The six other NAND gates generate NAND-ed outputs that are the activation signals for the PFET devices PF3, PF5, PF7, PF9, PF11, PF13 comprising the pull-up PFET array (110). The six other NAND gates are activated by the data signal A, enable signal EN and the state of the 6 calibration signals B0-B5. As described, the LCC takes B0-B5 and B0BAR-B5BAR to create the NCW and PCW. The combined effect of the PFET array with the impedance contribution of the linear resistive element R improves the v/i output response during data transitioning, e.g., from logic low to logic high.

Inverter elements IN2, IN3, IN4, IN5, IN6 and IN7 are connected at the NAND gate outputs to generate signals PB0BAR, PB1BAR, PB2BAR, PB3BAR, PB4BAR and PB5BAR. These inverted NAND output signals control activation of the six complementary NFETs: NF4, NF6, NF8, NF10, NF12 and NF14 of the pull-up array (110), each connected in parallel to ones of the six PFETs PF3, PF5, PF7, PF9, PF11, PF13 comprising the pull-up array 110 (at each PFET respective binary weighted bit position). The reader should note that the 6-bit size of the pull-up array is arbitrary, and defined herein for explanatory purposes only. The number of PFETs comprising a pull-up stage (110), as well as the number of NFETs in the pull-down stage (120), and corresponding control and calibration logic and calibration words PCW, NCW may be modified to any number of active pull-up PFET (and pull-down NFET) devices arranged in parallel, and in parallel with a complementary NFET device (or a complementary PFET device in the pull-down stage) to accommodate various v/i requirements.

In the NOR-based control logic (140) for controlling the pull-down stage (120), a first NOR GATE 1 generates control signal NBASE that is applied as a gate input to the NFET base device NF1 (in the base bit position). To generate signal NBASE, data input signal A, an enable signal ENBAR (for enabling output I/O driver operation) and base device activate signal PNDRIVEBAR are NOR-ed by a first NOR GATE 1. An inverter element IN8 connected to the first NOR GATE 1 output inverts signal NBASE to generate signal NBASEBAR. NBASEBAR controls the complementary PFET PF2 connected in parallel with the NFET base device NF1.

The NOR-based control logic (140) includes six other NOR gates: NOR GATE 2, NOR GATE 3, NOR GATE 4, NOR GATE 5, NOR GATE 6 and NOR GATE 7, with NOR outputs for generating activation signals NB0, NB1, NB2, NB3, NB4 and NB5. These signals are for activating NFET devices NF3, NF5, NF7, NF9, NF11 and NF13, comprising the NFET pull-down array (120). The NOR outputs are enabled by data signal A, NFET enable signal ENBAR and impedance calibration signals B0BAR, B1BAR, B2BAR, B3BAR, B4BAR and B5BAR, respectively. Depending on the state of the signals B0BAR-B5BAR, the various NFETs comprising the array are activated. An active impedance generated by the NFET devices combined with the impedance contribution from the linear resistive element R improves v/i output response at data transitioning, e.g., from logic high to logic low.

Like the first NOR GATE 1, the other six NOR gates include inverter elements IN8, IN9, IN10, IN11, IN12, IN13 and IN14. The inverter elements invert the NOR outputs to generate signals NB0BAR, NB1BAR, NB2BAR, NB3BAR, NB4BAR and NB5BAR. These (inverted) activation signals are provided as gate inputs to respective ones of the six complementary PFETS: PF4, PF6, PF8, PF10, PF12 and PF14, connected in parallel the NFETs comprising the pull-down array (120), at each NFET respective binary weighted bit position. The reader should note that the 6-bit size of the pull-down array is arbitrary and defined herein for explanatory purposes only. The number of NFETs comprising a pull-down stage and corresponding control and calibration logic may be modified to any number of active NFET devices arranged in parallel, and individually in parallel with a complementary PFET device to accommodate various v/i requirements.

A second embodiment of the I/O driver with output impedance control is shown in FIG. 2. The FIG. 2 embodiment of the inventive I/O driver with a matched/flat output impedance response control is different in a number of respects to the FIG. 1 embodiment. When compared to the pull-up stage (110) of the active matching element in the FIG. 1 embodiment, in the pull-up stage (210) of the matching element in the FIG. 2 embodiment, the base PFET device PF1 in the base bit position is the only PFET in the PFET pull-up array (210) having a complementary NFET device NF2 connected in parallel. Like the FIG. 1 embodiment, the base PFET device PF1 is activated by the signal PBASE generated by the first NAND Gate 1, and the complementary NFET NF2 is activated by signal PBASEBAR generated by signal PBASE inverted by inverter IN1.

Each of the six PFET devices PF3, PF5, PF7, PF9, PF11 and PF13 comprising the PFET pull-up array (210) are activated by signals PB0, PB1, PB2, P133, PB4 and PB5 (pull-up calibration word PCW). Like the FIG. 1 embodiment, these signals are generated by other six NAND gates of the NAND-based control logic (230) of the logical control section LCC which are: NAND GATE 2, NAND GATE 3, NAND GATE 4, NAND GATE 5, NAND GATE 6 and NAND GATE 7. There are no inverted outputs of the PFET pull-up array activation signals in view of the fact that the PFET array does not include the complementary NFETS (NF4, NF6, NF8, NF10, NF12, NF14) included in the FIG. 1 embodiment.

When compared to the pull-down stage (120) of the active matching element in the FIG. 1 embodiment, in the pull-down stage (220) of the active matching element in the FIG. 2 embodiment, the base NFET device NF1 in the base bit position is the only NFET in the NFET pull-down NFET array having a complementary PFET device PF2 connected in parallel. Like the FIG. 1 embodiment, the base NFET device NF1 is activated by the signal NBASE generated by the first NOR Gate 1, and the complementary PFET PF2 is activated by signal NBASEBAR generated by signal NBASE inverted by inverter IN2.

Each of the six NFET devices NF3, NF5, NF7, NF9, NF11 and NF13 comprising the NFET pull-down array are activated by signals NB0, NB1, NB2, NB3, NB4 and NB5 (pull-down calibration word NCW). Like the FIG. 1 embodiment, these signals are generated by other six NOR gates of the NOR-based control logic (240) of the logical control section LCC which are: NOR GATE 2, NOR GATE 3, NOR GATE 4, NOR GATE 5, NOR GATE 6 and NOR GATE 7. There are no inverted outputs of the NFET pull-up array activation signals in view of the fact that the PFET array does not include the complementary PFETS included in the FIG. 1 embodiment. Significantly, each of NFETs NF1, NF2, NF3, NF5, NF7, NF9, NF11 and NF13, which are driven by signals NBASE, PBASEBAR, NB0, NB1, NB2, NB3, NB4 and NB5, respectively, are stacked in series with NFETs NF15, NF16, NF17, NF18, NF19, NF20, NF21 and NF22, respectively. NFETs NF15, NF16, NF17, NF18, NF19, NF20, NF21 and NF22 are activated by signal EN. The stacked NFETs are included in the FIG. 2 pull-down stage (220) for additional electrostatic discharge (ESD) protection, for example.

As stated, while the complementary FETs improve linearity of the output impedance at switching, e.g., between logic high and low levels, the use of the comparative large series resistor R provides the appropriate balance with the FET array responses at switching. If 80% of the I/O output impedance at the pad (PAD) comprises the linear resistor R, then only 20% of the output impedance will exhibit variations in linearity due to the source to drain voltage on the PFET and NFET devices comprising the respective pull-up and pull-down stages. Using complementary devices to improve the linearity of that portion of the output impedance derived from the FET devices allows for the reduction in the percentage the series resistor contributes to the overall output impedance while still maintaining output impedance linearity. Reducing the percentage of the output impedance contributed by a linear resistive element, or the resistor shown to 50%-60% allows for smaller output devices while maintaining the linearity and the same desired output impedance, as well as less chip area consumed, and lowered output pin capacitance.

Although a few examples of the present invention are shown and described, it would be appreciated by those skilled in the art that changes might be made in these embodiments without departing from the principles and spirit of the invention, the scope of which is defined in the claims and their equivalents.

What is claimed is:

1. An I/O driver with v/i characteristic control for maintaining a substantially flat output impedance response using a configuration at an I/O output pad, the configuration comprising:

a linear resistive element electrically connected at the I/O output pad for limiting variations of a processed I/O signal; and an active impedance matching element for receiving and processing pull-up and pull-down array calibration words and a data signal comprising data represented by a series of voltage state transitions to generate and output the processed I/O signal to the linear resistive element such that the I/O output pad displays a substantially flat v/i response at switching of the data signal, the active impedance matching element further comprising a pull-up stage and a pull-down stage, wherein the pull-up stage comprises:

a pull-up array including PFET devices connected in parallel and configured to exhibit different conductance values corresponding to binary weighted bit positions of a PFET calibration word that controls activation of the PFET devices for providing active impedance compensation at switching of the data signal from a low value to a higher value;

a pull-up base circuit including a base PFET device connected in parallel with the PFET devices in the pull-up array; and a first stack of at least two series connected complementary NFETs, the first stack being connected in parallel with the base PFET device of the pull-up array; and wherein the pull-down stage comprises:

a pull-down array of NFET devices connected in parallel and configured to exhibit different conductance values corresponding to binary weighted bit positions of an NFET calibration word that controls array device activation and active impedance compensation at switching of the data signal from the higher value to the low value;

NFET stacks formed by connecting each of the NFET devices in series with at least a further NFET device that is enabled when the pull-down array is enabled;

a pull-down base circuit including a base NFET device connected in series with at least an additional NFET device to form a second stack, the second stack being connected in parallel with the NFET stacks of the pull-down array, and at least one complementary PFET connected in parallel with the second stack including base NFET device; and a logical circuit for controlling the active impedance matching element for providing inputs to the pull-up array and the pull-down array, the inputs including the pull-up and pull-down array calibration words and inputs to the pull-up base circuit and to the pull-down base circuit;

wherein during I/O operation, a combined impedance contribution from the linear resistive element and the active impedance matching element provides for the substantially flat output impedance.

2. The I/O driver as set forth in claim 1, wherein the logical circuit includes pull-up logic for controlling the pull-up array and pull-down logic for controlling the pull-down array, wherein the pull-up logic comprises:

a first NAND gate for generating a NAND gate output that enables the base PFET device when an the data signal, a matching element enable signal and a pull-up stage enable signal are present at inputs of the first NAND gate; and a set of further NAND gates for generating NAND output signals that enable the PFET devices of the pull-up array when the data signal, the matching element enable signal and PFET enable signals corresponding to each of the PFET devices are present at respective inputs of the further NAND gates; and wherein the pull-down logic comprises:

a first NOR gate for generating a NOR gate output that enables the base NFET device when an data signal, a matching element enable signal and a pull-down stage enable signal are present at inputs of the first NOR gate; and a set of further NOR gates for generating NOR output signals that enable the NFET devices of the pull-down array when the data signal, the matching element enable signal and NFET enable signals corresponding to each of the NFET devices are present at respective inputs of the further NOR gates.

3. The I/O driver as set forth in claim 1, wherein a ratio of an impedance contribution of the output impedance of the linear resistive element and the active impedance matching element is at least 4 to 1.

* * * * *